(12) United States Patent
Chattopadhyay et al.

(10) Patent No.: US 9,548,855 B2
(45) Date of Patent: Jan. 17, 2017

(54) METHOD AND APPARATUS FOR MANAGING ESTIMATION AND CALIBRATION OF NON-IDEALITY OF A PHASE INTERPOLATOR (PI)-BASED CLOCK AND DATA RECOVERY (CDR) CIRCUIT

(71) Applicants: Biman Chattopadhyay, Bangalore (IN); Sujoy Chakravarty, Bangalore (IN); Ravi Mehta, Bangalore (IN); Gopalkrishna Nayak, Bangalore (IN)

(72) Inventors: Biman Chattopadhyay, Bangalore (IN); Sujoy Chakravarty, Bangalore (IN); Ravi Mehta, Bangalore (IN); Gopalkrishna Nayak, Bangalore (IN)

(73) Assignee: SILAB TECH PVT. LTD., Bangalore (IN)

(*) Notice: Subject to any disclaimer, the term of this patent is extended or adjusted under 35 U.S.C. 154(b) by 0 days.

(21) Appl. No.: 14/834,357

(22) Filed: Aug. 24, 2015

(65) Prior Publication Data

US 2016/0056949 A1 Feb. 25, 2016

Related U.S. Application Data

(60) Provisional application No. 61/868,105, filed on Aug. 21, 2013, provisional application No. 62/039,942, filed on Aug. 21, 2014.

(51) Int. Cl.
| | | |
|---|---|---|
| H04L 7/00 | (2006.01) | |
| H04L 1/00 | (2006.01) | |
| H03L 7/091 | (2006.01) | |

(52) U.S. Cl.
CPC .............. *H04L 7/0025* (2013.01); *H03L 7/091* (2013.01); *H04L 1/0001* (2013.01); *H04L 7/0004* (2013.01)

(58) Field of Classification Search
CPC ............................ H04L 7/0025; H04L 7/0008
See application file for complete search history.

(56) References Cited

U.S. PATENT DOCUMENTS

| | | | |
|---|---|---|---|
| 7,046,058 B1 * | 5/2006 | Fang ..................... | H03L 7/0818 327/158 |
| 7,511,980 B2 | 3/2009 | Arsovski et al. | |
| 7,548,105 B2 * | 6/2009 | Shrank ............. | G01R 31/31725 327/158 |
| 7,688,610 B2 | 3/2010 | Arsovski et al. | |
| 7,907,661 B2 * | 3/2011 | Provost .................. | H04B 3/462 327/141 |

(Continued)

*Primary Examiner* — Sophia Vlahos

(57) ABSTRACT

A system and method for managing estimation and calibration of non-ideality of a Clock and Data Recovery circuit includes phase interpolators (PIs), first and second sets of delay elements, and a clock delay element. A first delay element of the first set of delay elements is programmed using a first digital delay control code (DDCC). The clock delay element is calibrated using a digital external delay control code (DEDCC) till a predetermined criterion is met, and is retained for subsequent use. The remaining delay elements of the first set of delay elements are separately calibrated based on the DEDCC. A first delay element of the second set of delay elements is programmed using a second DDCC. The DEDCC is readjusted for the second set of delay elements. The remaining delay elements of the second set of delay elements are separately calibrated based on the readjusted DEDCC.

6 Claims, 8 Drawing Sheets

(56) References Cited

U.S. PATENT DOCUMENTS

| | | |
|---|---|---|
| 8,121,239 B2* | 2/2012 | Yin .......................... H03L 7/06 |
| | | 375/355 |
| 8,204,153 B2 | 6/2012 | Yamaguchi et al. |
| 8,300,754 B2 | 10/2012 | Nedovic et al. |
| 8,346,188 B2* | 1/2013 | Subburaj .............. H04B 1/3822 |
| | | 455/113 |
| 8,446,198 B2* | 5/2013 | Kamath ................... H03L 7/00 |
| | | 327/161 |
| 8,934,594 B1* | 1/2015 | Malhotra ............ H04L 27/2338 |
| | | 375/355 |
| 2003/0081709 A1* | 5/2003 | Ngo .......................... H03L 7/07 |
| | | 375/362 |
| 2006/0140321 A1* | 6/2006 | Tell ....................... H03L 7/0814 |
| | | 375/376 |
| 2007/0160173 A1 | 7/2007 | Takeuchi |
| 2011/0008055 A1 | 1/2011 | Effenberger |
| 2013/0063192 A1* | 3/2013 | Ferriss ................. H03L 7/0891 |
| | | 327/157 |
| 2014/0253195 A1* | 9/2014 | Chandrasekaran .. H03K 5/1565 |
| | | 327/175 |
| 2015/0200765 A1* | 7/2015 | Bonaccio ............. H04L 7/0029 |
| | | 375/374 |
| 2015/0326203 A1* | 11/2015 | Da Dalt ................ H03H 11/20 |
| | | 327/237 |

* cited by examiner

METHOD AND APPARATUS FOR MANAGING ESTIMATION AND CALIBRATION OF NON-IDEALITY OF A PHASE INTERPOLATOR (PI)-BASED CLOCK AND DATA RECOVERY (CDR) CIRCUIT

CROSS-REFERENCE TO RELATED APPLICATIONS

This application claims the benefit of, and is a continuation-in-part of the following provisional applications, which are hereby incorporated by reference in their entirety: U.S. Provisional Patent Application No. 61/868,105, captioned "METHOD AND APPARATUS FOR MANAGING estimation and CALIBRATION OF NON-IDEALITY OF A PHASE INTERPOLATOR (PI)-BASED CLOCK AND DATA RECOVERY (CDR) CIRCUIT" filed Aug. 21, 2013 and U.S. Provisional Patent Application No. 62/039,942, captioned "METHOD AND APPARATUS FOR MANAGING estimation and CALIBRATION OF NON-IDEALITY OF A PHASE INTERPOLATOR (PI)-BASED CLOCK AND DATA RECOVERY (CDR) CIRCUIT" filed Aug. 21, 2014.

BACKGROUND OF THE INVENTION

Field of the Invention

Embodiments of the present invention generally relate to clock and data recovery (CDR) systems, and more particularly, to managing estimation and calibration of non-ideality of a Phase Interpolator (PI) in PI-based CDR system.

Description of the Related Art

In order to communicate data from a transmitter to a receiver across a signal line, the receiver must know when to sample the data signal that the receiver receives from the transmitter. In many systems, this information is provided by a timing (or clock) signal sent from the transmitter to the receiver along a dedicated timing (or clock) signal line adjacent to the data signal line.

In systems with relatively low signaling rates, the receiver can directly use an internally buffered version of a timing signal to extract the data from the data signal, as used in Synchronous dynamic random access memory (SDRAM) technology. In systems with higher signaling rates, however, the receiver typically requires a clock alignment circuit, such as a Phase Locked Loop (PLL) or Delay Locked Loop (DLL). The clock alignment circuits create an internal sampling clock signal, precisely aligned with the received timing signal, to extract the data from the data signal, as used in Dynamic RAM (DRAM) and Double data rate (DDR) technologies. Regardless of whether a clock alignment circuit is used, the data and timing lines must be well matched to eliminate timing skews between them which reduce a system's timing margin.

As data rates continue to increase, it is becoming increasingly difficult to match the data and timing signal lines to eliminate timing skews. Furthermore, requiring a timing signal line to be routed along with the data line(s) is costly in terms of board area and power. An attractive option is to remove the timing line and instead use a circuit on the receiver that requires only the data signal to determine when to sample the data signal to most reliably extract the data. The circuit is called a clock and data recovery (CDR) circuit.

Although CDRs are typically designed using a modified phase-locked loop (PLL), such PLL-based CDRs are difficult to design, costly in terms of power and area, and suffer from several other limitations. For example, in designing a PLL-based CDR, the designer must compromise between the ability to track the data signal and noise suppression of the PLL. Additionally, the dynamics of PLL-based CDRs are dependent on the contents of the data signal, and PLL-based CDRs can have a long locking time since they must lock to both the frequency and phase of the data signal. PLL-based CDRs also suffer from analog offsets and device mismatches, which can cause the receiver circuitry to sense the data signal at shifted, sub-optimal sampling points. Lastly, for receivers receiving multiple data signals, a dedicated PLL-based CDR must be provided for each data signal. Providing dedicated PLL-based CDR for each data signal is a costly requirement since the PLLs typically require relatively large silicon area (e.g. for large filter capacitors) and dissipate relatively large amounts of power (e.g. for various high speed PLL components).

In widely used serial communication, the data is transmitted from the transmitter to receiver without a synchronous clock. The received data suffers from asynchronous and noise effects. To recover the data, a system needs to extract a clock and use the extracted clock to synchronize and clear the data. The system is called clock and data recovery (CDR) system.

However, the received data accumulates jitter and noise during transmission. Thus, adjusting the phase of the recovery clock based on the received data is a chief function in the CDR system. In general, low bit-error-rate (BER) communication of data over a communications channel is often considered an important requirement in many systems. To recover the data correctly and decrease the BER, the extracted clock needs to track the phase of the received data timely and accurately.

The BER is a function of many parameters, including a phase of a clock signal or phases of clock signals. An incorrect phase or timing of a respective clock signal may reduce a timing margin and/or increase the BER. As a consequence, communications devices and systems often include components, such as phase locked loops (PLLs), delay locked loops (DLLs) and phase interpolators (PIs), that allow the phase of the respective clock signal to be adjusted. For example, a PI may generate the respective clock signal having the phase that corresponds to a control signal applied to the PI. The control signal may specify a phase step or setting.

PI is the most critical module in the CDR system. However, the PI suffers from non-linearity. The non-linearity of the PI directly affects the dynamic characteristic of the CDR system thereby leading to an error. While a frequency difference exists between the input data and the local clock, it also affects the jitter tolerance of the CDR system. Many of the timing problems related to high-speed signaling are mitigated through the use of phase-interpolating circuits to generate precise clock phases.

Unfortunately, there may be nonlinearities or errors in a mapping from the phase code or step to the phase of the respective clock signal. Resulting phase errors may adversely impact the device and/or system performance, as discussed above. As a consequence, testing of such nonlinearities (or the converse, timing linearity) is often included in the characterization and acceptance of devices, such as integrated circuits. This testing is often performed using dedicated, external test equipment. Such test equipment, however, is often expensive. The accuracy and/or repeatability of the test equipment may be insufficient. Testing for nonlinearities over a wide range of phase steps may be time consuming, thereby further increasing the expense.

Another problem is that the nonlinearities of PIs become unacceptably large in the presence of process variations and routing mismatches. The non-linearity errors result in inaccurate clock timing, and may go unnoticed in high volume manufacturing (HVM). The non-linearity errors result in wrong timing margining results or poor input/output (I/O) performance due to inaccurate timing training.

PI-based CDR circuits are commonly used in high speed serial I/O links to recover data signals that have become distorted due to noise or attenuation. In a typical data recovery circuit, three identical PI circuits are often used. Thus, in order to minimize the layout area, segmented PI circuits, consisting of two circuit stages, are often implemented to allow for high-resolution phase interpolation. However, the segmented PI circuit design has shown a high level of non-linearity during what is known as inter-quadrant switching. Specifically, some existing segmented PI circuits have shown 30 ps phase non-linearity during inter-quadrant switching, which is high when compared to a desirable step adjustment target of 6.6 ps. The high non-linearity caused by inter-quadrant switching has been shown to introduce a significant amount of jitter into the PI-based CDR circuit.

There is a need, therefore, for enhanced methods, apparatuses and systems for managing estimation and calibration of non-ideality or linearity of a PI-based CDR circuit.

SUMMARY

A method for managing estimation and calibration of non-ideality of a Clock and Data Recovery (CDR) circuit. The method comprises A) selecting a first output path for calibration comprising at least a first Phase Interpolator (PI) of a plurality of PIs, at least one of a plurality of output-side programmable delay elements, an external delay element, at least one sampler, a first and a second external multiplexer, B) programming the output-side programmable delay element using a Digital Delay Control Code (DDCC), C) calibrating the external delay element until a given predetermined criterion based on an early-late detection method is met, D) upon satisfaction of the predetermined criterion, retaining a corresponding Digital External Delay Control Code (DEDCC) in the external delay element for subsequent use, E) selecting a second output path for calibration comprising at least a second PI of the plurality of PIs, the at least one of the plurality of output-side programmable delay elements, external delay element, at least one sampler, the first and second external multiplexers, F) calibrating the output-side programmable delay element until the given predetermined criterion based on the early-late detection method is met, G) upon satisfaction of the predetermined criterion, retaining the corresponding DDCC in the output-side programmable delay element for subsequent use, H) repeating the steps E-G for each of the remaining PIs such that the remaining output-side programmable delay elements are each separately calibrated, I) selecting a first input path for calibration comprising the at least first Phase Interpolator (PI) of the plurality of PIs, at least one of the plurality of input-side programmable delay elements, the external delay element, at least one sampler, the first and second external multiplexers, J) programming the input-side programmable delay element using the Digital Delay Control Code (DDCC), K) calibrating the external delay element until the given predetermined criterion based on the early-late detection method is met, L) upon satisfaction of the predetermined criterion, retaining a corresponding Digital External Delay Control Code (DEDCC) in the external delay element for subsequent use and M) assigning at least one value of a Binary Control Code (BCC) to select a unique phase in a given quadrant of a full phase cycle, N) calibrating the input-side programmable delay element until the given predetermined criterion based on the early-late detection method is met, O) upon satisfaction of the predetermined criterion, retaining the corresponding DDCBC in the input-side programmable delay element for subsequent use and P) repeating the steps M-O for each of the remaining unique phases in the inputs to the PI such that the remaining input-side programmable delay elements are each separately calibrated.

A method for managing estimation and calibration of output errors of a PI in a Clock and Data Recovery (CDR) circuit. The method comprises A) selecting a first output path for calibration comprising at least a first Phase Interpolator (PI) of a plurality of PIs, at least one of a plurality of output-side programmable delay elements, an external delay element, at least one sampler, a first and a second external multiplexer, B) programming the output-side programmable delay element using a Digital Delay Control Code (DDCC), C) calibrating the external delay element until a given predetermined criterion based on an early-late detection method is met, D) upon satisfaction of the predetermined criterion, retaining a corresponding Digital External Delay Control Code (DEDCC) in the external delay element for subsequent use, E) selecting a second output path for calibration comprising at least a second PI of the plurality of PIs, the at least one of the plurality of output-side programmable delay elements, external delay element, at least one sampler, the first and second external multiplexers, F) calibrating the output-side programmable delay element until the given predetermined criterion based on the early-late detection method is met, G) upon satisfaction of the predetermined criterion, retaining the corresponding DDCC in the output-side programmable delay element for subsequent use and H) repeating the steps E-G for each of the remaining PIs such that the remaining output-side programmable delay elements are each separately calibrated.

A method for managing estimation and calibration of input errors of a PI in a Clock and Data Recovery (CDR) circuit. The method comprises A) selecting a first input path for calibration comprising at least a first Phase Interpolator (PI) of the plurality of PIs, at least one of a plurality of input-side programmable delay elements, an external delay element, at least one sampler, a first and a second external multiplexer, B) programming the input-side programmable delay element using the Digital Delay Control Code (DDCC), C) calibrating the external delay element until the given predetermined criterion based on the early-late detection method is met, D) upon satisfaction of the predetermined criterion, retaining a corresponding Digital External Delay Control Code (DEDCC) in the external delay element for subsequent use, and E) assigning at least one value of a Binary Control Code (BCC) to select a unique phase in a given quadrant of a full phase cycle, F) calibrating the input-side programmable delay element until the given predetermined criterion based on the early-late detection method is met, G) upon satisfaction of the predetermined criterion, retaining the corresponding DDCBC in the input-side programmable delay element for subsequent use and H) repeating the steps E-G for each of the remaining unique phases in the inputs to the PI such that the remaining input-side programmable delay elements are each separately calibrated.

A Clock and Data Recovery (CDR) circuit for dynamic calibration of Integral Nonlinearity (INL). The circuit comprises at least a plurality of Phase Interpolators (PIs), at least a plurality of samplers, a Phase Detector (PD) for detecting early and late signals, a first (1st) order proportional and a second (or 2nd) order integral loop for using the detected early and late signals so as to control the PIs for tracking phase of an incoming data and a memory unit. The memory unit comprises at least one of a dedicated hard wired, soft wired program, and a combination thereof, for capturing statistics in connection with a sequence of a Binary Control Code (BCC) of the PIs to determine non-uniformity in the frequency of occurrence of one or more combinations thereof, a storage subunit for storing one or more codes for correction of the INL of the PIs and at least one of an adaptive, dynamic hardwired, soft wired program, and a combination thereof, for implementing the one or more stored codes for correction of the INL of the PIs

DETAILED DESCRIPTION

Various embodiments of method and apparatus for managing estimation and calibration of non-ideality or linearity of a PI-based CDR circuit are described. In the following detailed description, numerous specific details are set forth to provide a thorough understanding of claimed subject matter. However, it will be understood by those skilled in the art that claimed subject matter may be practiced without these specific details. In other instances, methods, apparatuses or systems that would be known by one of ordinary skill have not been described in detail so as not to obscure claimed subject matter.

Some portions of the detailed description that follow are presented in terms of algorithms or symbolic representations of operations on binary digital signals stored within a memory of a specific apparatus or special purpose computing device or platform. In the context of this particular specification, the term specific apparatus or the like includes a general purpose computer once it is programmed to perform particular functions pursuant to instructions from program software. Algorithmic descriptions or symbolic representations are examples of techniques used by those of ordinary skill in the signal processing, data processing and analytics or related arts to convey the substance of their work to others skilled in the art. An algorithm is here, and is generally, considered to be a self-consistent sequence of operations or similar signal processing, data processing and analytics leading to a desired result. In this context, operations or processing involve physical manipulation of physical quantities. Typically, although not necessarily, such quantities may take the form of electrical or magnetic signals capable of being stored, transferred, combined, compared or otherwise manipulated. It has proven convenient at times, principally for reasons of common usage, to refer to such signals as bits, data, values, elements, symbols, characters, terms, numbers, numerals or the like. It should be understood, however, that all of these or similar terms are to be associated with appropriate physical quantities and are merely convenient labels. Unless specifically stated otherwise, as apparent from the following discussion, it is appreciated that throughout this specification discussions utilizing terms such as "processing," "computing," "calculating," "determining" or the like refer to actions or processes of a specific apparatus, such as a special purpose computer or a similar special purpose electronic computing device. In the context of this specification, therefore, a special purpose computer or a similar special purpose electronic computing device is capable of manipulating or transforming signals, typically represented as physical electronic or magnetic quantities within memories, registers, or other information storage devices, transmission devices, or display devices of the special purpose computer or similar special purpose electronic computing device.

Figure 1:
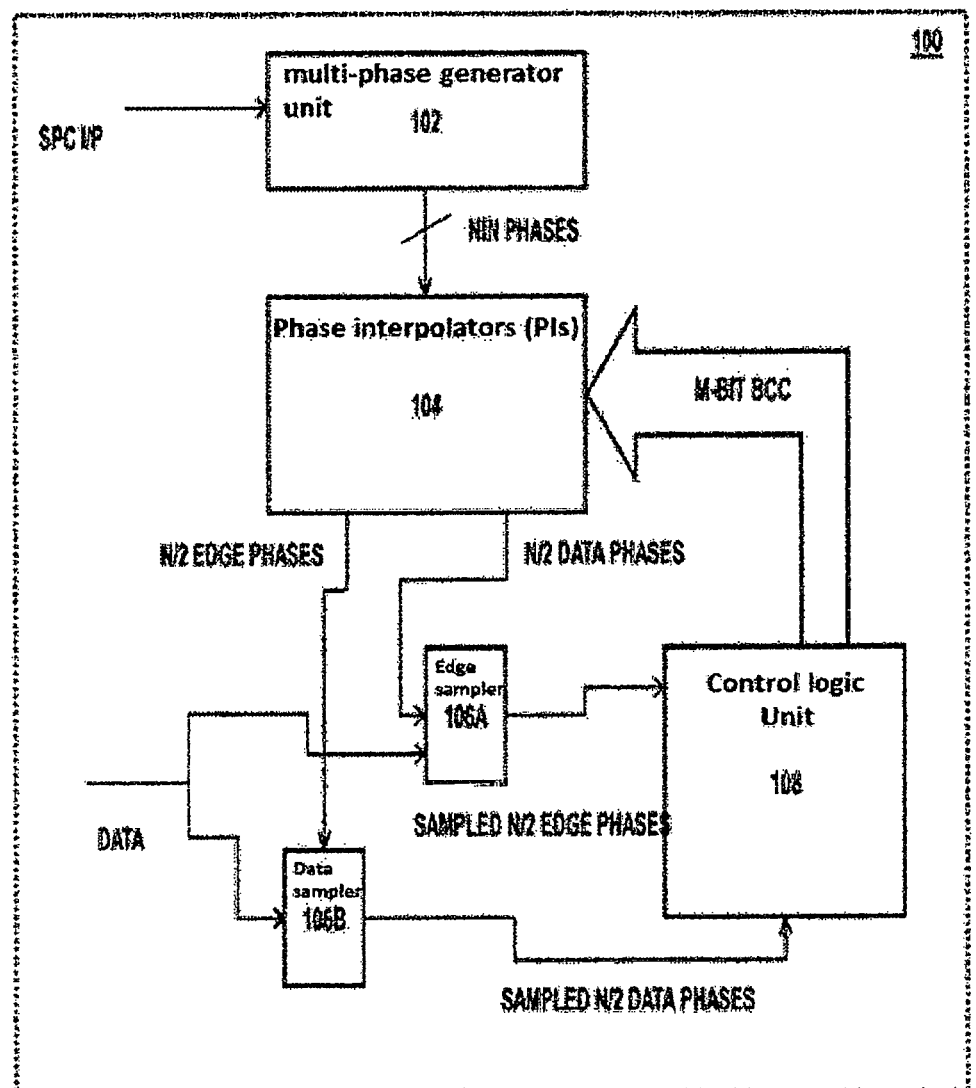
FIG. 1 depicts a high-level block diagrammatic representation of a Phase Interpolator (PI)-based Clock and Data Recovery (CDR) system, designed and implemented in one or more embodiments, in accordance with the principles of the present invention.

FIG. 1 depicts a high-level block diagrammatic representation of a Phase Interpolator (PI)-based Clock and Data Recovery (CDR) system, designed and implemented in one or more embodiments, in accordance with the principles of the present invention.

The PI-based CDR system 100 comprises a multiple-phase generation unit 102, at least a pair of samplers 106A and 106B, a CDR control logic unit 108 and at least a plurality of Phase Interpolators (PIs) 104.

The multiple-phase generator unit 102 generates multiple output waveforms similar to the input waveform, such that the output waveforms are equispaced (or equidistant) to each other in terms of phase in a full or complete 2-π radians (or 360° degrees) phase cycle. For example, and in no way limiting the scope of the invention, the multiple-phase generator unit 102 comprises at least one of one or more Phase-Locked Loops (PLLs) and Delay-Locked Loops (DLLs).

As depicted in FIG. 1, in the one or more design embodiments involving deployment and implementation of the at least one of the one or more PLLs 102, in operation, a Single-Phase Clock Input (SPC I/P) signal at a given frequency, namely F, is fed, to the input of, or as input to, the at least one of the one or more PLLs 102. Upon inputting the SPC V/P signal at the given frequency F, the at least one of the one or more PLLs 102 generates NIN distinct equidistant phases at the same given frequency F. For example, and in no way limiting the scope of the invention, in the event that the number of distinct equidistant phases is NIN=4, the Four (4) phases are called Quadrature phases and are labeled as 0°, 90°, 180°, 270° or 0, π/4, π/2, 3*π/4 radians, for purposes of clarity and expediency.

In general, PI is a critical circuit in the receiver of the serial link. The PI allows the receiver to adjust the phase of the sampling clocks therefor in very fine increments. The PI facilitates manages interpolation of phases in a given full or complete phase cycle.

In some embodiments, for example, and in no way limiting the scope of the invention, the plurality of Phase Interpolators (PIs) 104 is in essence an array of PIs 104 formed via deployment of multiple instances of the PI 104. For instance, in some embodiments, the array of PIs 104 comprises N instances of the PI 104. For purposes of clarity and expediency, the N instances of the PI 104 are hereinafter referred to as 104A, 104B . . . 104N (not explicitly shown herein).

As depicted in FIG. 1, in operation, the NIN=4 distinct equidistant phases generated by at least one of the one or more PLLs 102 are fed to the inputs of, or as inputs to, the at least one of the plurality of Phase Interpolators (PIs) 104. Stated differently, the NIN=4 distinct equidistant phases generated by each of the one or more PLLs 102 are correspondingly fed as inputs to, or fed to the inputs of, each of the plurality of Phase Interpolators (PIs) 104. Upon inputting the NIN=4 distinct equidistant phases, each of the plurality of Phase Interpolators (PIs) 104 generates NOUT distinct interpolated phases via phase interpolation.

However, in general scenarios, in operation, the NIN distinct equidistant phases generated by any conventional PLL fed as input to the PI comprise errors with respect to corresponding ideal positions of the NIN distinct equidistant phases, which are represented by an Equation 1 as under:

$$((n/NIN)*(2*\pi)), \quad \text{Equation 1}$$

wherein n represents the nth phase for n=0, 1 . . . (NIN−1), and wherein NIN is the total number of distinct equidistant phases and 2*π is the total angle subtended at the centre of a unit phase circle.

Specifically, each of the errors corresponds to the ideal position of each of the NIN distinct equidistant phases. For purposes of clarity and expediency, each of the errors corresponding to the ideal position of each of the N distinct equidistant phases is hereinafter referred to as Input Phase Error or I/P_E (0), I/P_E (1) . . . I/P_E (NIN−1), respectively. More specifically, each of the aforementioned errors is the deviation from the ideal position of each of the NIN distinct equidistant phases.

Specifically, in operation, upon inputting the NIN=4 distinct equidistant phases, each of the plurality of Phase Interpolators (PIs) 104 generates NOUT distinct interpolated phases via phase interpolation. For example, in some scenarios, the NOUT distinct interpolated phases are equidistant, wherein the NOUT is not necessarily equal to NIN. In some scenarios, NOUT distinct interpolated phases are produced by N instances of PI 104. In some embodiments involving deployment of differential PI, the number of instances of PI 104 required is N/2.

In operation, multiple phases of clock generated from the PI 104 are utilized for sampling an input data stream of higher data rate using a clock of lower frequency, as described hereinafter.

In operation, the input data rate of the SPC I/P signal is (F*N)/2, wherein F is the clock rate (or clock frequency) and N is the number of clock phases of a given clock signal. In the event that the clock signal with the N clock phases and clock rate F is used to sample the incoming data of the SPC I/P signal at (F*N)/2, N samples corresponding to N/2 bits and Two (2) samples per data bit are obtained. For each bit, a first sample is referred to as an edge-sample, whereas a second sample referred to as a data-sample, for purposes of clarity and expediency.

However, in general scenarios, in operation, the NOUT distinct equidistant phases generated by any conventional PI comprise errors with respect to corresponding ideal positions of the NOUT distinct equidistant phases, which are represented by an Equation 2 as under:

$$((n/NOUT)*(2*\pi)), \quad \text{Equation 2}$$

wherein n represents the nth phase for n=0, 1 . . . (NOUT−1), and wherein NOUT is the total number of distinct equidistant phases and 2*π is the total angle subtended at the centre of a unit phase circle.

Specifically, each of the errors corresponds to the ideal position of each of the NOUT distinct equidistant phases. For purposes of clarity and expediency, each of the errors corresponding to the ideal position of each of the N distinct equidistant phases is hereinafter referred to as Output Phase Error or O/P_E (0), I/P_E (1) . . . O/P_E (NOUT−1), respectively. More specifically, each of the aforementioned errors is the deviation from the ideal position of each of the NOUT distinct equidistant phases.

In some embodiments, the NOUT distinct equidistantly interpolated phases are logically partitioned into one or more sets of distinct phases with homogeneous cardinality. For example, and in no way limiting the scope of the invention, the logically partitioning, as defined herein, is specifically implemented in a manner such that the NOUT distinct equidistantly interpolated phases comprise Two (2) sets of N/2 distinct phases. For purposes of clarity and expediency, the Two (2) sets of N/2 distinct phases are hereinafter referred to as N/2 edge phases and N/2 data phases respectively. More specifically, the NOUT distinct equidistantly interpolated phases comprise a continuous arrangement of alternately adjacently positioned edge and data phases, wherein every Two (2) alternately juxtaposed phases comprise a preceding edge phase and a proceeding data phase. Still, more specifically, the logically partitioning facilitates formation of N/2 edge phases and N/2 data phases respectively. As depicted in FIG. 1, for purposes of further clarity and expediency, the N/2 edge phases are hereinafter referred to as NEP=0, 2 . . . (NOUT−2), whereas the N/2 data phases are hereinafter referred to as NDP=1, 3 . . . (NOUT−1), respectively.

As depicted in FIG. 1, amongst the pair of samplers 106A and 106B, the sampler 106A serves as an edge sampler whereas the sampler 106B serves as a data sampler. Specifically, each of the pair of samplers 106A and 106B comprises at least a plurality of samplers (not shown here explicitly). For example, the edge sampler 106A comprises N/2 edge samplers, whereas the data sampler 106B comprises N/2 data samplers. The pair of samplers 106A and 106B facilitates sampling or reduction of a continuous signal to a discrete signal. The pair of samplers 106A and 106B extract samples from the continuous signals.

Yet again, as depicted in FIG. 1, in operation, the N/2 edge phases, namely NEP=0, 2 . . . NOUT−2, are fed to the inputs of the edge sampler 106A, whereas the N/2 data phases, namely NDP=1, 3 . . . NOUT−1, are fed to the inputs of the data sampler 106B. On the other hand, the other inputs of both the edge and data samplers 106A and 106B are supplied with the common data.

For example, and in no way limiting the scope of the invention, both the edge and data samplers 106A and 106B are STRONGARM™ sense amplifiers. Specifically, the STRONGARM™ sense amplifiers 106A and 106B are employed to achieve high sampling rate at low power.

In operation, the edge sampler 106A generates sampled N/2 edge phases, whereas the data sampler 106B generates sampled N/2 data phases.

As shown in FIG. 1, in operation, one of the inputs of the CDR control logic unit 108 is fed with the sampled N/2 edge phases, whereas the other input of the CDR control logic unit 108 is fed with the sampled N/2 data phases.

Further, in operation, the CDR control logic unit 108 uses the N/2 data and N/2 edge samples (or sampled N/2 edge and data phases) to adjust the positions of the phases so that the edge-phases are aligned with the transition of the data edge and the data-phases aligned to the data center of the data based on Alexander Phase Detection (PD) principle, also known as the early-late detection method.

As used in the current context, Table 1 below provides a tabular representation for an exemplary 3-Bit, Mod-8 (23) and Step-1 sequence of combinations in connection with early and late signals.

| 3-BIT, MOD-8 AND STEP-1 SEQUENCE OF COMBINATIONS | | | | |
|---|---|---|---|---|
| COMBI-NATION NUMBER | DATA SAMPLE AT TIME T − 1, DS (T − 1) | DATA SAMPLE AT TIME T, DS (T) | EDGE SAMPLE AT TIME T − ½, ES (T − ½) | COMMENTS |
| 1 | −1 | −1 | −1 | NO ACTION (DON'T CARE) |
| 2 | −1 | −1 | 1 | NO ACTION (DON'T CARE) |
| 3 | −1 | 1 | −1 | EARLY |
| 4 | −1 | 1 | 1 | LATE |
| 5 | 1 | −1 | −1 | LATE |
| 6 | 1 | −1 | 1 | EARLY |
| 7 | 1 | 1 | −1 | NO ACTION (DON'T CARE) |
| 8 | 1 | 1 | 1 | NO ACTION (DON'T CARE) |

For purposes of clarity and expediency, in the Table 1, a high level logical state is represented as "1", whereas a low level logical state is represented as "−1".

Still further, in operation, the CDR control logic unit 108 generates a suitable control code as an output. More specifically, the suitable control code is an M-Bit Binary Control Code (M-BIT BCC). The output of the CDR control logic unit 108 is fed back to the each of the plurality of Phase Interpolators (PIs) 104 as input.

Figure 2:
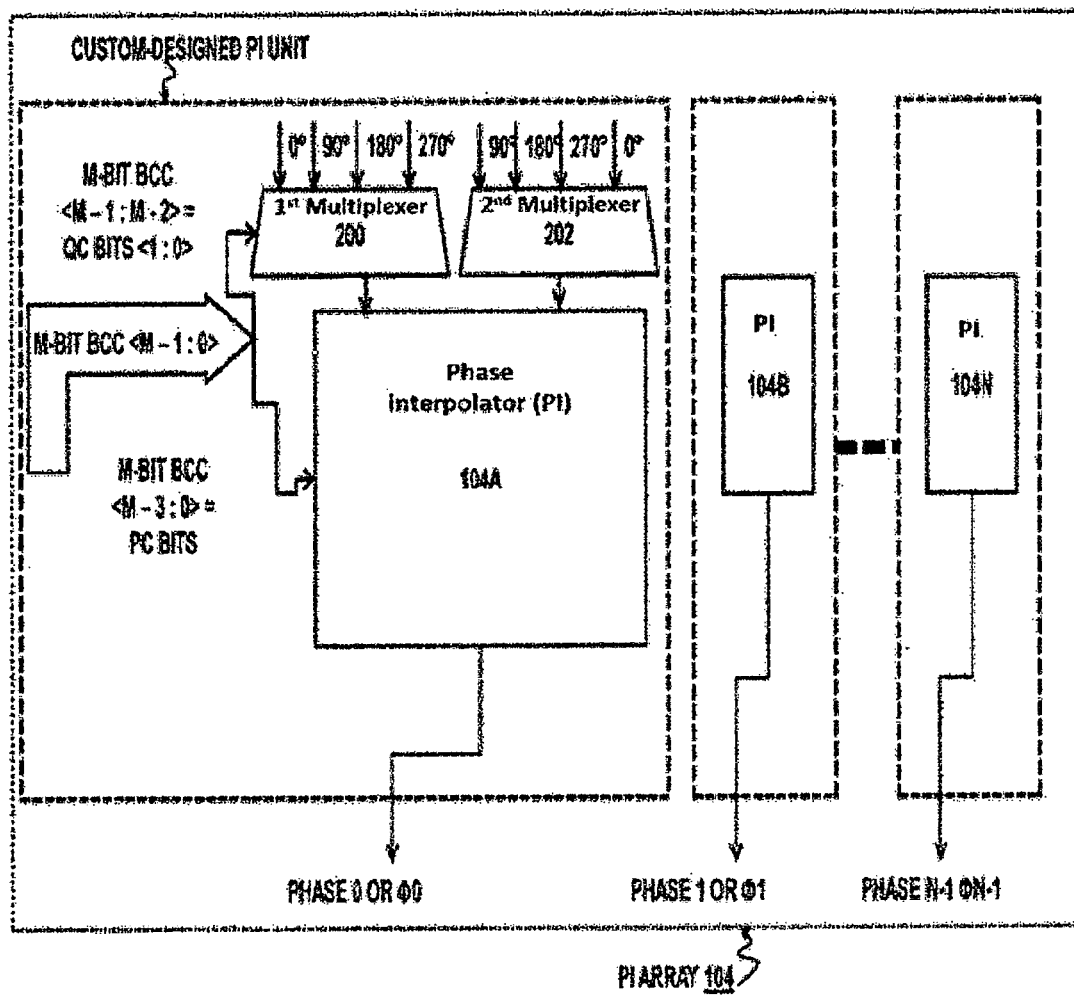
FIG. 2 depicts a detailed block diagram of the PI designed and implemented in one or more embodiments, in accordance with the principles of the present.

FIG. 2 depicts a detailed block diagram of the PI designed and implemented in one or more embodiments, in accordance with the principles of the present.

With reference to FIGS. 1-2, the plurality of Phase Interpolators (PIs) 104 is in essence an array of PIs 104 formed via deployment of multiple instances of the PI 104. For instance, in some embodiments, the array of PIs 104 comprises N instances of the PI 104. For purposes of clarity and expediency, the N instances of the PI 104 are hereinafter referred to as 104A, 104B . . . 104N (not explicitly shown herein).

In some embodiments, for example, and in no way limiting the scope of the invention, each instance of the PI 104 constituting the array of PIs 104 is a customized PI unit, designed and implemented in accordance with the principles of the present invention. For purposes of clarity and expediency, as depicted in FIG. 2, each customized PI unit is clearly delineated or demarcated as a dotted rectangle. Thus, the array of PIs 104 comprises a contiguous arrangement of one or more of the customized PI unit.

As depicted in FIG. 2, each customized PI unit comprises one instance of the PI 104 constituting the array of PIs 104, for example 104A, and a pair of multiplexers, namely first and second multiplexers 200 and 202, respectively.

In some embodiments, the M-BIT BCC comprises a customized control data structure, defined in accordance with the principles of the present invention. For example, and in no way limiting the scope of the invention, by virtue of the customized control data structure the Two (2) Most Significant Bits (MSBs) of the M-BIT BCC, for instance BIT [M−1] and BIT [M−2] with range <M−2:M−1> and size of the range [(M−1)-(M−2)+1], are allocated for logical partitioning of a unit phase circle (or a full or complete 2-π radians (or 360° degrees) phase cycle) into Four (4) distinct quadrants of operation, namely QUAD 1, QUAD 2, QUAD 3 and QUAD 4, respectively, thereby facilitating selection of the partitioned quadrants of operation thereof. For purposes of clarity and expediency, the 2 MSBs are hereinafter referred to as Quad Control Bits (QC BITS) with size 2.

In operation, the QC BITS facilitate logical partitioning of a unit phase circle into one or more distinct quadrants of operation, and identification and selection of one or more partitioned quadrants of operation thereof.

As used in the current context, a Table 2 below provides a tabular representation for an exemplary 2-Bit, Mod-4 and Step-1 sequence of combinations in connection with the 4 distinct quadrants, namely the QUAD 1, QUAD 2, QUAD 3 and QUAD 4, respectively, thereby facilitating logical partitioning, identification and selection of the quadrants.

| 2-BIT, MOD-4 AND STEP-1 SEQUENCE OF COMBINATIONS | | | | |
|---|---|---|---|---|
| | M-BIT BCC BITS | | QUADRANT | |
| COMBINATION NUMBER | BIT [M − 1] | BIT [M − 2] | NUMBER SELECTED | PHASES SELECTED |
| 1 | 0 | 0 | QUAD 1 | 0° AND 90° |
| 2 | 0 | 1 | QUAD 2 | 90° AND 180° |
| 3 | 1 | 0 | QUAD 3 | 180° AND 270° |
| 4 | 1 | 1 | QUAD 4 | 270° AND 0° |

Further, the remnant bits of the M-BIT BCC, for instance BIT [M−3] . . . BIT [0] with range <0:M−3>, are allocated for managing interpolation of phases. For purposes of clarity and expediency, the remnant (M−2) bits with the range <0:M−3> are hereinafter referred to as Phase Control Bits (PC BITS).

In operation, each customized PI unit 104 is supplied with the M-BIT BCC with range <M−1:0> as an input. Further, the M-BIT BCC input is bifurcated into two distinct inputs, namely the PC BITS and QC BITS, respectively.

As depicted in FIG. 2, specifically, each customized PI unit 104 comprises of Three (3) inputs, namely a first, second and third, respectively.

As depicted in FIG. 2, Two (2) of the inputs, for instance the first and second, of the PI 104A are correspondingly coupled to Two (2) multiplexers 200 and 202, respectively. Specifically, the first input of the PI 104A is coupled to the first multiplexer 200; whereas the second input of the PI 104A is coupled to the second multiplexer 202.

As depicted in FIG. 2, the third input of the PI 104A is fed with the PC BITS of the M-BIT BCC. For example, the PC BITS of the M-BIT BCC have the range <0:M−3>.

For example, and in no way limiting the scope of the invention, as depicted in FIG. 2, the remnant 2 MSBs of the M-BIT BCC, for instance BIT [M−1] and BIT [M−2] with range <M−2:M−1>, are allocated for logical partitioning of a unit phase circle (or a full or complete 2-π radians (or 360° degrees) phase cycle) into Four (4) distinct quadrants, namely QUAD 1, QUAD 2, QUAD 3 and QUAD 4, respectively, and selection of the partitioned quadrants thereof fed as inputs to the select lines of the pair of multiplexers 200 and 202. For purposes of clarity and expediency, the remnant 2 MSBs with the range <M−2:M−1> are hereinafter referred to as Quad Control Bits (QC BITS).

The M-bits of the M-BIT BCC facilitate management of one or more output phases. Specifically, the M-bits of the M-BIT BCC facilitate positioning of the one of the output phases anywhere in the full phase-space of a given unit phase circle with the central angle of 2*π radians (or 360°). More specifically, the M-bits of the M-BIT BCC facilitate positioning of the one or more output phases via selection of one or more phases confined to a given quadrant of the given unit phase circle.

Further, as depicted in FIG. 2, the first multiplexer 200 is supplied with Four (4) distinct inputs, namely a first, second, third and fourth, whereas the multiplexer 202 is supplied with Four (4) distinct inputs, namely a fifth, sixth, seventh and eighth, respectively. Specifically, each of the 4 distinct inputs of each of the pair of multiplexers 200 and 202 are supplied with 4 distinct equidistant phases. For example, the 4 distinct equidistant phases are orthogonally separated (or apart), i.e. by an angle of by 90°, i.e. 360°/4=90°.

The first multiplexer 200 has 4 distinct equidistant phases 0°, 90°, 180° and 270° as inputs, whereas the second multiplexer 202 has 4 distinct equidistant phases 90°, 180°, 270° and 0° as inputs, respectively. In other words, the assignment of the inputs to the multiplexer 202 is the right shifted rotation of the assignment of the inputs to the multiplexer 200. The aforementioned pattern in connection with assignment of inputs to the pair of multiplexers is repeated for all other customized PI units, namely 104B . . . 104N.

The output of the customized PI unit 104A is a distinct output phase, namely a PHASE 0 (φ0). Likewise, the output of each of the remnant custom-designed PI units 104B . . . 104N forming the array of PIs 104 is a distinct output phase. For purposes of clarity and expediency, the outputs of the remnant customized PI units 104B . . . 104N comprising the array of PIs 104 is hereinafter correspondingly referred to as a PHASE 1 (φ1) . . . PHASE (N−1) (φ(N−1)), respectively. Of note is the fact that for purposes of convenience and to avoid redundancy all ins-and-outs in connection with the remnant customized PI units 104B . . . 104N comprising the PIs 104 have not been detailed herein.

Figure 3:
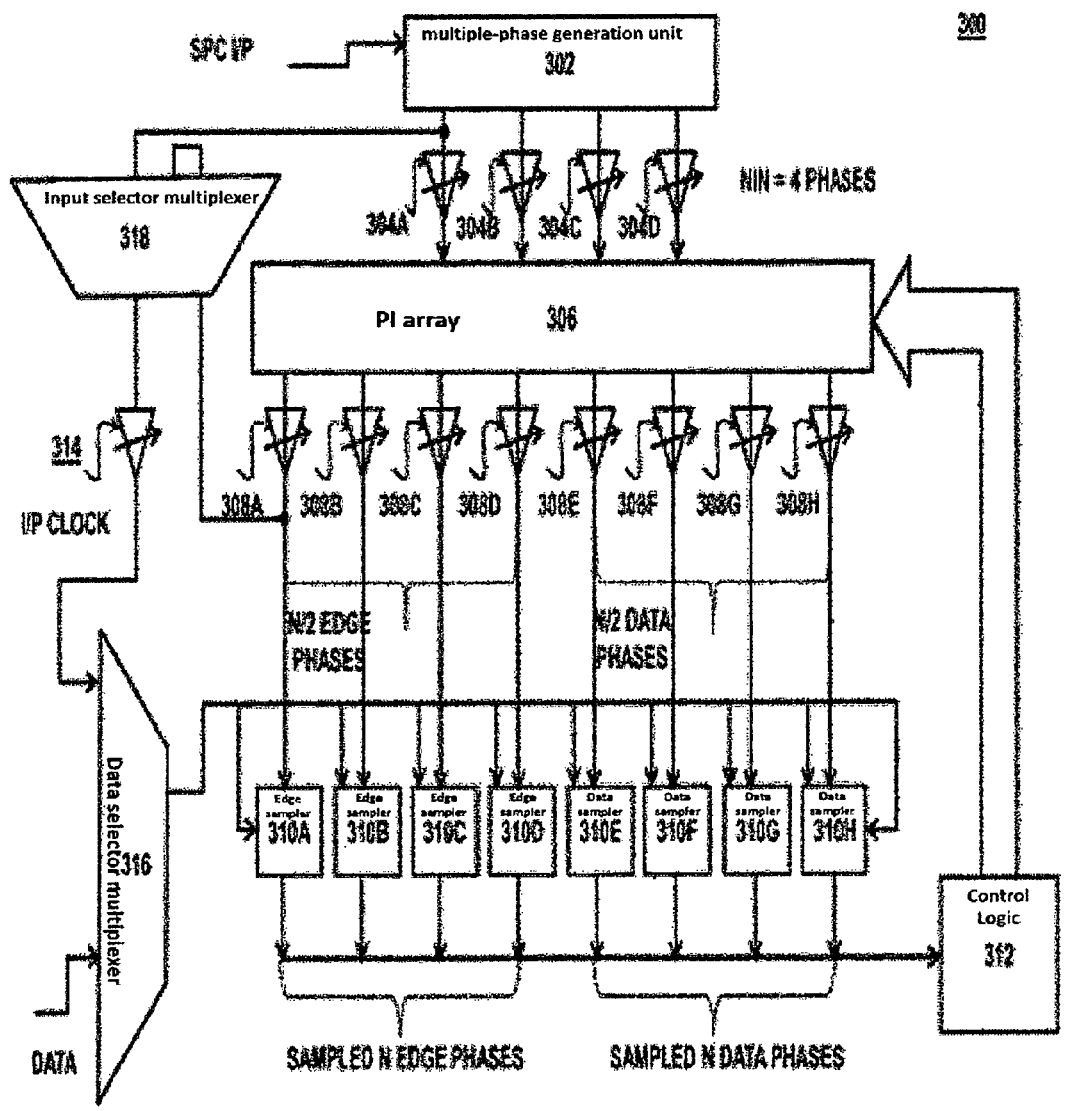
FIG. 3 depicts a block diagram demonstrating use of a modified PI-based CDR for correction of both input and output side errors in connection with the PI thereof, according to one or more embodiments.

FIG. 3 depicts a block diagram demonstrating use of a modified PI-based CDR for correction of both input and output side errors in connection with the PI thereof, according to one or more embodiments.

As depicted in FIG. 3, the modified PI-based CDR 300 comprises a multiple-phase generation unit 302, a plurality of input-side programmable delay elements 304, a PI array 306, a plurality of output-side programmable delay elements 308, a plurality of samplers 310, a CDR control logic unit 312, an external delay element 314, a first external multiplexer 316 and a second external multiplexer 318, respectively.

In some embodiments, for example, and in no way limiting the scope of the invention, the multiple-phase generation unit 302 comprises at least one of one or more Delay-Locked Loops (DLLs) and a Phase-Locked Loops (PLLs). Specifically, the multiple-phase generation unit 302 facilitates producing an output waveform similar to the input waveform, only delayed by a certain amount of time.

In some embodiments involving deployment of the PLL, the PLL generates an output signal whose phase is related to the phase of an input signal. Specifically, the PLL consists of a variable frequency oscillator and a phase detector. More specifically, the variable frequency oscillator generates a periodic signal. On the other hand, the phase detector compares the phase of the generated periodic signal with the phase of the input periodic signal and adjusts the variable frequency oscillator to keep the phases matched. Bringing the output signal back to the input signal for comparison is called a feedback loop owing to the fact that the output signal is 'fed back' to the input forming a loop.

In some scenarios involving clock recovery in high-speed serial data streams via deployment of the PLL, the data streams are sent without an accompanying clock. For instance, the high speed data sent in a Serializer/Deserializer (SERDES) is an example of data with embedded clock. The receiver generates a clock from an approximate frequency reference, and phase-aligns to the transitions in the data stream using the phase interpolator. The generation of the clock from the approximate frequency reference, and the phase-alignment to the transitions in the data stream is referred to as clock recovery. In order for the foregoing scheme to work, the data stream must have a transition frequently enough to correct any phase/frequency drift in the local recovered clock.

As depicted in FIG. 3, in some embodiments involving deployment of the one or more PLLs 302, the PLLs 302 facilitate CDR.

As depicted in FIG. 3, the input of the at least one of the one or more PLLs 302 is fed with a Single-Phase Clock Input (SPC I/P) signal. Specifically, in operation, the SPC I/P signal at a given frequency F is fed to the input of the at least one of the one or more PLLs 302. Upon inputting the SPC I/P signal at the given frequency F, the at least one of the one or more PLLs 302 generate one or more distinct equidistant phases, for instance NIN, at the same given frequency F.

In some embodiments, NIN distinct equidistant phases are generated by the at least one of the one or more PLLs 302. However, as depicted in FIG. 3, for purposes of illustration, and in no way limiting the scope of the invention, the total number of distinct output phases, for instance NIN, generated by at least one of the one or more PLLs 302 is limited to Four (4) only, i.e. NIN=4. For purposes of clarity and expediency, the 4 distinct output phases are 90°, 180°, 270° and 360°, respectively.

However, generally, in operation, the NIN distinct equidistant phases generated by any conventional PLL if fed as input to at least one of the one or more the PIs comprises errors with respect to corresponding ideal positions of the NIN distinct equidistant phases, which are represented by the Equation 1:

$$((n/NIN)*(2*\pi)),\quad \text{Equation 1}$$

wherein n is the position number of a given phase such that n=0, 1 . . . (NIN−1), NIN is the total number of distinct equidistant phases and 2*π is the total angle subtended at the centre of a unit phase circle.

Specifically, each of the errors corresponds to the ideal position of each of the NIN distinct equidistant phases. For purposes of clarity and expediency, the errors corresponding to the ideal positions of the NIN distinct equidistant phases are hereinafter referred to as I/P_E (0), I/P_E (1), I/P_E (2) . . . I/P_E (NIN−1). More specifically, each of the errors is the deviation from the ideal position of each of the N distinct equidistant phases.

In some embodiments, the NOUT distinct interpolated phases are logically partitioned into one or more sets of N/2 distinct phases. For example, and in no way limiting the scope of the invention, the logically partitioning, as defined herein, is specifically implemented in a manner such that the NOUT distinct interpolated phases comprise Two (2) sets of N/2 distinct phases. For purposes of clarity and expediency, the Two (2) sets of N/2 distinct phases are hereinafter referred to as N/2 edge phases and N/2 data phases respectively. More specifically, the NOUT distinct phases comprise a continuous arrangement of alternately adjacently positioned edge and data phases, wherein every Two (2) alternately juxtaposed phases comprise a preceding edge phase and a proceeding data phase. Still, more specifically, the logically partitioning facilitates formation of N/2 edge phases and N/2 data phases respectively. For purposes of further clarity and expediency, the N/2 edge phases are hereinafter referred to as NEP=0, 2 . . . (NOUT−2), whereas the N/2 data phases are hereinafter referred to as NDP=1, 3 . . . (NOUT−1), respectively.

In some embodiments, each of the plurality of input-side programmable delay elements 304 is capable of being independently programmed using a digital control code. For example, in no way limiting the scope of the invention, as depicted in FIG. 3, the total number of input-side programmable delay elements 304 selected is Four (4). For purposes of clarity and expediency, the 4 input-side programmable delay elements 304 are hereinafter referred to as 304A, 30B, 304C and 304D, respectively.

As depicted in FIG. 3, each of the 4 outputs of the PLL 302 is correspondingly coupled to each of the 4 input-side programmable delay elements 304A, 304B, 304C and 304D. Stated otherwise, each of the 4 inputs of the at least one of the one or more the PIs 306 is coupled to the each of the 4 input-side programmable delay elements 304A, 304B, 304C and 304D.

In some specific embodiments, the PI array 306 comprises plurality of PIs 306. Stated otherwise, the PI array 306 comprises multiple or plural instances of the PI 306.

In some embodiments, each of the plurality of output-side programmable delay elements 308 are capable of being programmed using a digital delay control code. For example, in no way limiting the scope of the invention, as depicted in FIG. 3, the total number of output-side programmable delay elements 308 selected is Eight (8). For purposes of clarity and expediency, the 8 output-side programmable delay elements 308 are hereinafter referred to as 308A, 308B, 308C, 308D, 308E, 308F, 308G and 308H respectively.

As depicted in FIG. 3, each of the Eight (8) outputs of at least one of the one or more the PIs (or PI array) 306 is correspondingly coupled to each of the 8 output-side programmable delay elements 308A, 308B, 308C, 308D, 308E, 308F, 308G and 308H, respectively.

In operation, the at least one of the one or more the PIs (or PI array) 306 generates one or more distinct edge and data phases. For example, and in no way limiting the scope of the invention, as depicted in FIG. 3, the at least one of the one or more the PIs (or PI array) 306 generates N/2 distinct edge phases and N/2 distinct data phases, respectively.

In some embodiments, the plurality of samplers 310 comprises one or more samplers serving as edge samplers and others as data samplers. For purposes of clarity and expediency, as shown in FIG. 3, the 4 edge samplers are hereinafter referred to as 310A, 310B, 310C and 310D respectively, whereas the 4 data samplers are hereinafter referred to as 310E, 310F, 310G and 310H respectively.

As depicted in FIG. 3, one input of each of the edge samplers 310A, 310B, 310C and 310D is correspondingly coupled to the outputs of each of the output-side programmable delay elements 308A, 308B, 308C and 308D, in that order. Likewise, on the other hand, one input of each of the data samplers 310E, 310F, 310G and 310H is correspondingly coupled to the outputs of each of the output-side programmable delay elements 308E, 308F, 308G and 308H, in that order.

Further, as depicted in FIG. 3, another input of each of the edge samplers 310A, 310B, 310C and 310D and each of the data samplers 310E, 310F, 310G and 310H is correspondingly coupled to the common output of the first external multiplexer 316.

Still further, as depicted in FIG. 3, the outputs of the each of the edge samplers 310A, 310B, 310C and 310D and each of the data samplers 310E, 310F, 310G and 310H is correspondingly coupled to the common input of the CDR control logic unit 312.

As depicted in FIG. 3, the first external multiplexer 316 is fed with two inputs, namely an input clock and a data.

The output of the multiplexer 316 is in essence the common output.

The input of the input-side programmable delay element 304A is split prior to feeding as input to the input-side programmable delay elements 304A and fed as input to the external delay element 314 via the input of the second external multiplexer 318. The output of the external delay element 314 is fed as the input clock to the first external multiplexer 316.

Figure 4A:
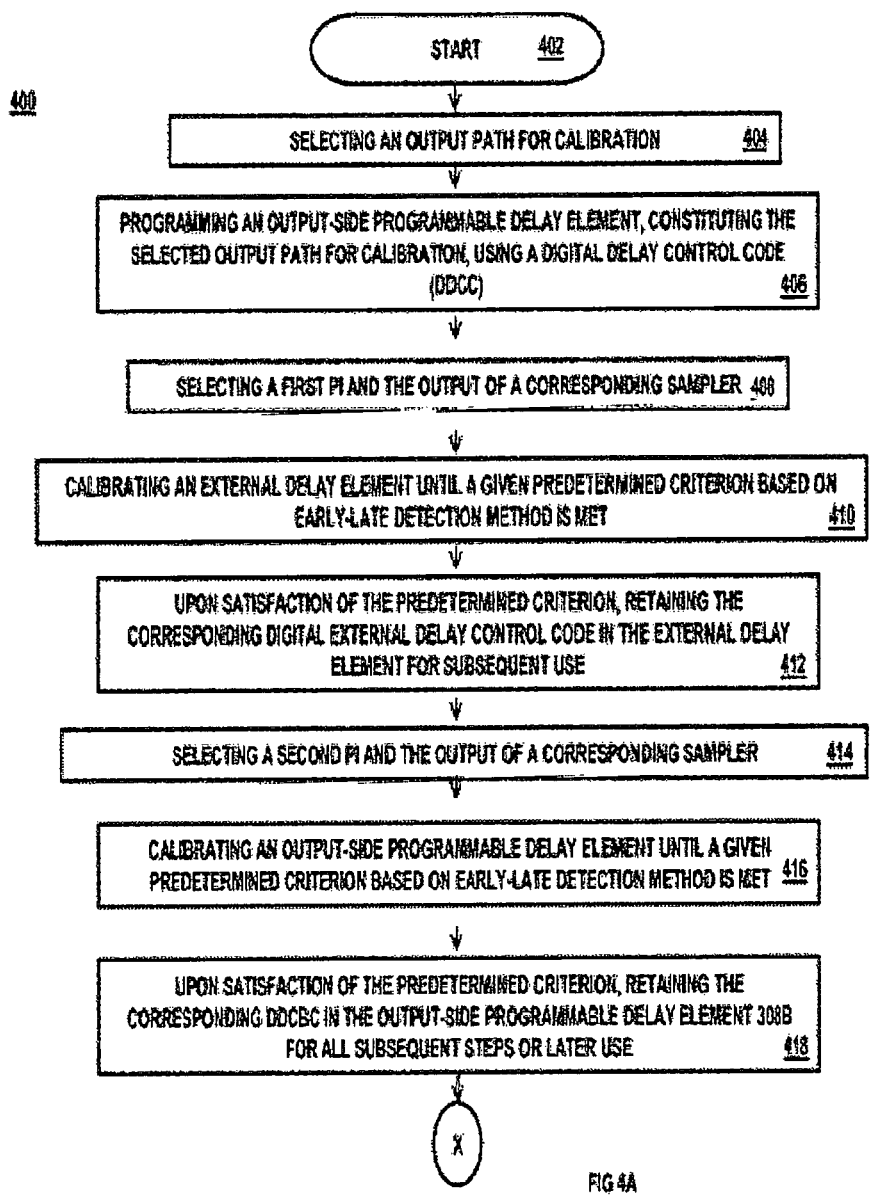
FIGS. 4A-B depict a flow diagram for a method for selection, estimation and calibration of the output paths in the modified PI-based CDR system, according to one or more embodiments.
Figure 4B:
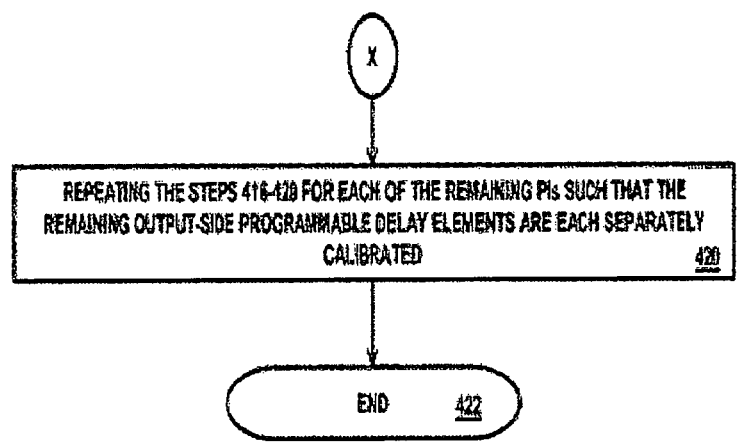

FIGS. 4A-B depict a flow diagram for a method for selection, estimation and calibration of the output paths in the modified PI-based CDR system, according to one or more embodiments.

The method 400 starts at step 402 and proceeds to step 404.

At step 404, the method 400 comprises selecting an output path for calibration. Specifically, the method 400 facilitates selecting the output path for calibration using the second external multiplexer 318, of FIG. 3. More specifically, in calibration of the selected output path the first external multiplexer 316 selects the clock input and not the data input. For example, and in no way limiting the scope of the invention, in operation, the second external multiplexer 318 selects the output path comprising the output-side programmable delay element 308A and the edge sampler 310A, for purposes of calibration of the output error associated therewith. More specifically, the second external multiplexer 318 selects the output of the output-side programmable delay element 308A, for purposes of calibration of the output side error associated therewith.

At step 406, the method 400 comprises programming the output-side programmable delay element, constituting the selected output path for calibration, using a Digital Delay Control Code (DDCC).

Reiterating again, in operation, the output-side programmable delay element 308A is programmed using the DDCC. For example, and in no way limiting the scope of the invention, the DDCC is a binary code or DDCBC. Specifically, the Digital Delay Control Binary Code (DDCBC) comprises a sequence of combinations of plurality of DDCBC bits. In operation, the output-side programmable delay element 308A is set at a given selected value of the DDCBC. The output-side programmable delay element 308A stores and maintains (or holds) the given selected value of the DDCBC. For example, and in no way limiting the scope of the invention, the given selected value of the DDCBC is a given unique combination mid-way in the sequence of combinations of plurality of DDCBC bits. For instance, the sequence of combinations of plurality of DDCBC bits is a X-Bit, Mod-2X and Step-1 sequence of combinations of binary bits, wherein the number of binary bits in each combination of the sequence is X-bits, range of each combination is <0; X−1>, size of the sequence is 2X (or MAXCODE or SIZEOFCODE), step size is unity (or 1) and range of the sequence <0:2X−1>. Thus, the output-side programmable delay element 308A is set at a MIDCODE, i.e. ((MAXCODE or SIZEOFCODE+1)/2), which is mid-way in the aforementioned sequence, which the output-side programmable delay element 308A stores and maintains.

In operation, the method 400 comprises setting or assigning the MIDCODE of the DDCBC to the output-side programmable delay element 308A. Specifically, the MIDCODE is a given selected unique combination mid-way in the sequence of combinations of plurality of DDCBC bits. The output-side programmable delay element 308A stores and holds the assigned MIDCODE.

With reference to FIGS. 2-3, at step 408, the method 400 comprises selecting a first PI, and the output of the corresponding sampler, for example at least one of the first instance of the PI 306 of FIG. 3, and the output of the edge sampler 310A, and PI 104A of FIG. 2, in the PI array comprising multiple instances of the custom-designed PI units.

In some scenarios based on the Equation 2, in the event that all the QC and PC BITS are assigned all Zero (0) values, then a start phase, i.e. 0°, as output on the PHASE 0 or Φ0, which is the output of the PI 104A, of FIG. 2, is selected.

At step 410, the method 400 comprises calibrating an external delay element, for instance the external delay element 314, of FIG. 3, until a given predetermined criterion based on early-late detection method is met. Specifically, the given predetermined criterion is defined by an Equation 3, as under:

TOTAL NUMBER OF EARLY CLOCK SIGNALS=TOTAL NUMBER OF LATE CLOCK SIGNALS    Equation 3

In operation, the external delay element 314 is initialized and assigned a digital external delay control code. Further, the digital external delay control code stored in the external delay element 314 is sequentially altered till the predetermined criterion is met. Noticeable here is the fact that the early-late detection method has been discussed in detail in Table 1.

At step 412, the method 400 comprises upon satisfaction of the predetermined criterion, retaining the corresponding digital external delay control code in the external delay element 314 for all subsequent steps or later use.

With reference to FIGS. 2-3, at step 414, the method 400 comprises selecting a second PI, and the output of the corresponding sampler, for example at least one of the second instance of the PI 306 of FIG. 3, and the output of the edge sampler 310B, second instance of the PI 104B of FIG. 2, in the PI array comprising multiple instances of the custom-designed PI units.

In some scenarios based on the Equation 2, in the event that all the QC and PC BITS are assigned all Zero (0) values, then a start phase, i.e. 0°, as output on the PHASE 1 or Φ1, which is the output of the PI 104B, of FIG. 2, is selected.

At step 416, the method 400 comprises calibrating an output-side programmable delay element, for instance the output-side programmable delay element 308B, of FIG. 3, until a given predetermined criterion based on early-late detection method is met. Specifically, the given predetermined criterion is defined by an Equation 3, as under:

TOTAL NUMBER OF EARLY CLOCK SIGNALS=TOTAL NUMBER OF LATE CLOCK SIGNALS    Equation 3

In operation, the output-side programmable delay element 308B is initialized and assigned a Digital Delay Control Binary Code (DDCBC). Further, the DDCBC stored in the output-side programmable delay element 308B is sequentially altered till the predetermined criterion is met. Noticeable here is the fact that the early-late detection method has been discussed in detail in Table 1.

At step 418, the method 400 comprises upon satisfaction of the predetermined criterion, retaining the corresponding DDCBC in the output-side programmable delay element 308B for all subsequent steps or later use.

At step 420, the method 400 comprises repeating the steps 416-420 each of the remaining PIs such that the remaining output-side programmable delay elements 308C-H are each separately calibrated.

The method 400 proceeds to step 422 and ends.

Figure 5:
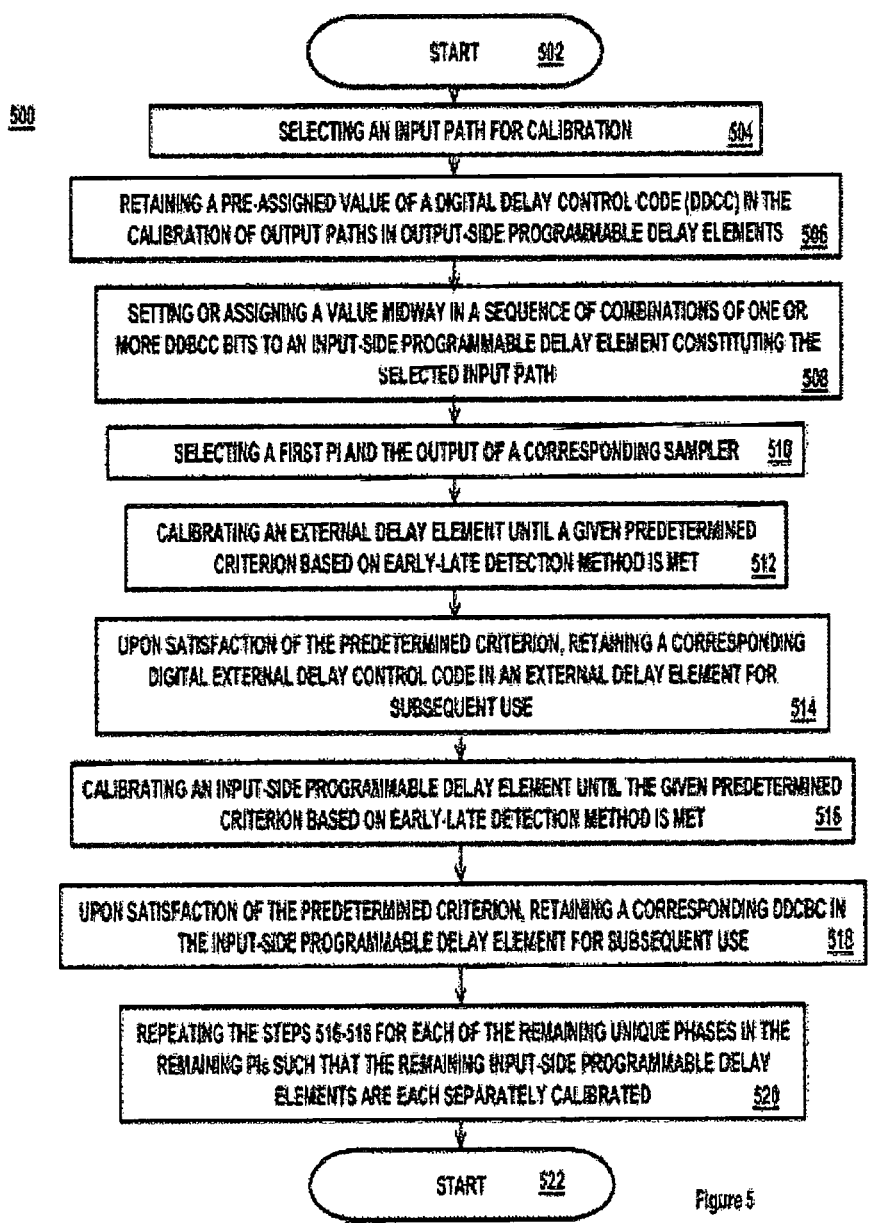
FIG. 5 depicts a flow diagram for a method for selection, estimation and calibration of the input paths in the modified PI-based CDR system, according to one or more embodiments.

FIG. 5 depicts a flow diagram for a method for selection, estimation and calibration of the input paths in the modified PI-based CDR system, according to one or more embodiments.

The method 500 starts at step 502 and proceeds to step 504.

At step 504, the method 500 comprises selecting an input path for calibration. Specifically, the method 400 facilitates selecting the input path for calibration using the first and second external multiplexers 316 and 318. For example, and in no way limiting the scope of the invention, in operation, both the first and second external multiplexers 316 and 318 facilitate selecting the input path comprising the input-side programmable delay element 304A, the output-side programmable delay element 308A and the edge sampler 310A. More specifically, the first and second external multiplexers 316 and 318 may select the input of the input-side programmable delay element 304A, for purposes of calibration of the associated input error thereof.

In operation, the output of the PLL 302 coupled to the input of the 304A is selected through the second external multiplexer 318 via the external delay element 314 and via the first external multiplexer 316, and fed as input to the edge sampler 310A.

At step 506, the method 500 further comprises retaining a previously assigned value of the Digital Delay Control Code (DDCC) in the calibration of the output paths in all the output-side programmable delay elements, for instance 308A-H.

At step 508, the method 500 comprises setting or assigning a value midway in the sequence of combinations of the DDBCC bits to the input-side programmable delay element 304A comprising the selected input path.

With reference to FIGS. 2-3, at step 510, the method 500 comprises selecting a first PI, and the output of the corresponding sampler, for example at least one of the first instance of the PI 306 of FIG. 3, and the output of the edge sampler 310B, first instance of the PI 104A of FIG. 2, in the PI array comprising multiple instances of the custom-designed PI units.

In some scenarios based on the Equation 2, in the event that all the QC and PC BITS are assigned all Zero (0) values, then a start phase, i.e. 0°, as output on the PHASE 0 or $\phi 0$, which is the output of the PI 104A, of FIG. 2, is selected.

At step 512, the method 500 comprises calibrating an external delay element, for instance the external delay element 314, of FIG. 3, until a given predetermined criterion based on early-late detection method is met. Specifically, the given predetermined criterion is defined by an Equation 3, as under:

$$\text{TOTAL NUMBER OF EARLY CLOCK SIGNALS} = \text{TOTAL NUMBER OF LATE CLOCK SIGNALS} \quad \text{Equation 3}$$

In operation, the external delay element 314 is initialized and assigned a digital external delay control code. Further, the digital external delay control code stored in the external delay element 314 is sequentially altered till the predetermined criterion is met. Noticeable here is the fact that the early-late detection method has been discussed in detail in Table 1.

At step 514, the method 500 comprises upon satisfaction of the predetermined criterion, retaining the corresponding digital external delay control code in the external delay element 314 for all subsequent steps or later use.

In some scenarios based on the Equation 2, in the event that all the QC BITS are assigned values "01", i.e. 90°, as output on the PHASE 0 or $\Phi 0$, which is the output of the PI 104A, of FIG. 2, is selected. The QC BITS of the M-BIT BCC are assigned values in accordance with the Table 2.

At step 516, the method 500 comprises calibrating an input-side programmable delay element, for instance the input-side programmable delay element 304B, of FIG. 3, until a given predetermined criterion based on early-late detection method is met. Specifically, the given predetermined criterion is defined by an Equation 3, as under:

$$\text{TOTAL NUMBER OF EARLY CLOCK SIGNALS} = \text{TOTAL NUMBER OF LATE CLOCK SIGNALS} \quad \text{Equation 3}$$

In operation, the input-side programmable delay element 304B is initialized and assigned a Digital Delay Control Binary Code (DDCBC). Further, the DDCBC stored in the input-side programmable delay element 304B is sequentially altered till the predetermined criterion is met. Noticeable here is the fact that the early-late detection method has been discussed in detail in Table 1.

At step 518, the method 500 comprises upon satisfaction of the predetermined criterion, retaining the corresponding DDCBC in the input-side programmable delay element 304B for all subsequent steps or later use.

At step 520, the method 500 comprises repeating the steps 516-518 for each of the remaining unique phases in the remaining PIs such that the remaining input-side programmable delay elements 308C-H are each separately calibrated. With reference to Table 2, the unique phases are selected based on the QC BITS of the M-BIT BCC.

The method 500 proceeds to step 522 and ends.

In some embodiments, both static and dynamic calibration of the Integral Nonlinearity (INL) using the modified PI-based CDR is disclosed, in accordance with the principles of the present invention.

Figure 6:
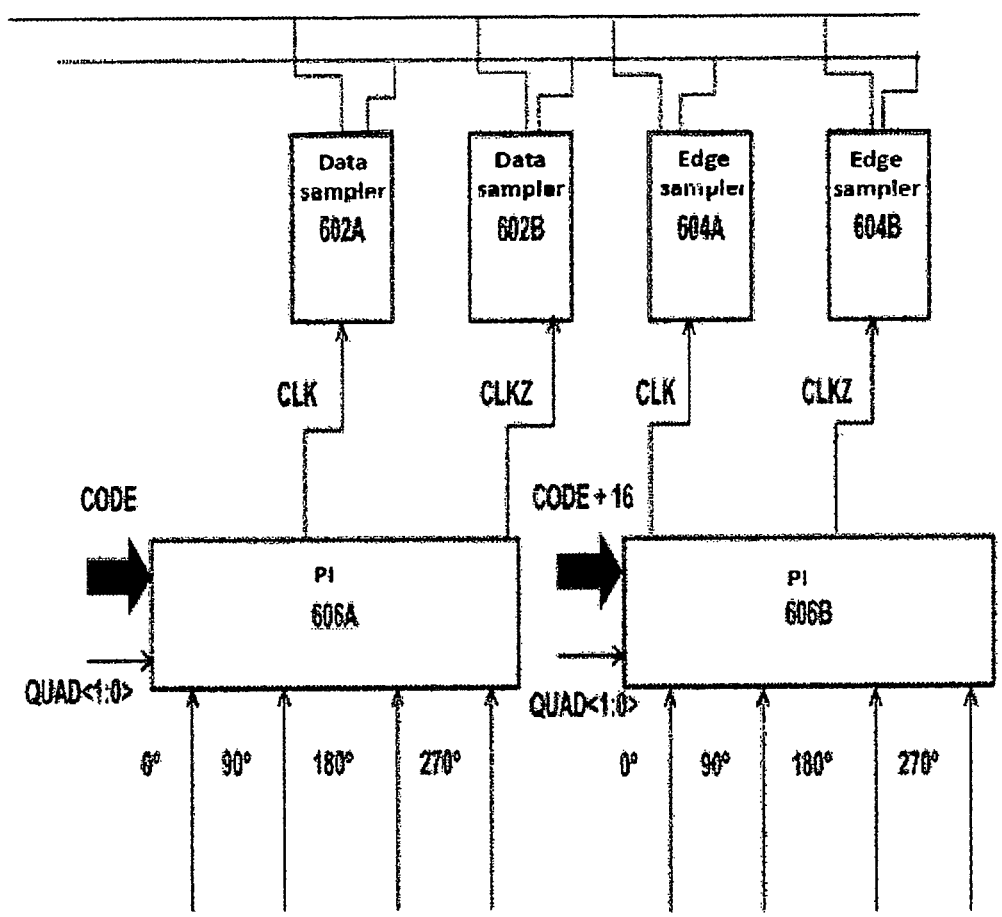
FIG. 6 depicts a block diagram demonstrating use a PI in a phase interpolator (PI)-based CDR, according to one or more embodiments.

FIG. 6 depicts a block diagram demonstrating use a PI in a phase interpolator (PI)-based CDR, according to one or more embodiments.

With reference to FIGS. 1-5, in the one or more embodiments, for example, and in no way limiting the scope of the invention, the number of distinct equidistant phases generated by the at least one of the one or more PLLs 102 NIN=4 and the number of distinct equidistant interpolated phases NOUT=8. By virtue of design and implementation of the PI-based CDR 600, a quad-rate architecture is realized, wherein the clock rate is F and the data rate is 4*F.

Of note is the fact that the pair of PI 606A and 606B is differential circuits. Thus, the CLK and CLZ signals are depicted as outputs of the pair of PI 606A and 606B.

As depicted in FIG. 6, in some embodiments, the PI-based CDR 600 may comprise at least a pair of data sampler 602A and 602B, at least a pair of edge sampler 604A and 604B and at least a pair of PI 606A and 606B.

As used in general, the term "thermometer or thermometric code" sometimes called unary coding, is an entropy encoding that represents a natural number, N, with N ones followed by a zero (if natural number is understood as non-negative integer) or with N–1 ones followed by a zero (if natural number is understood as strictly positive integer). For example, 5 is represented as 111110 or 11110. Some representations use N or N–1 zeros followed by a one. The ones and zeros are interchangeable without loss of generality. Unary coding is both a Prefix-free code and a Self-synchronizing code.

In some practical embodiments, the thermometric code is substituted by the PC BITS of the M-BIT BCC. For example, with reference to FIGS. 2 and 6, the M-BIT BCC <M−3:0>=PC BITS of the M-BIT BCC is analogical to CODE, whereas the M-BIT BCC <M−1:M−2>=QC BITS <1:0> is analogical to QUAD<1:0>.

As depicted in FIG. 6, the PI 606A comprises a pair of inputs, namely a first 32-bit thermometric code and a first quad <1:0> defining a first quadrant of operation in a unit phase circle. The 32-bit thermometric code is implemented over 2-bit quadrants thereby resulting in 128 steps, i.e. 32-bit thermometric code*22 (or 4)=128. For purposes of clarity and expediency, the 32-bit thermometric code controlling the PI 606A has been hereinafter referred to as a PI code. The PI 606A comprises a first set of four distinct phases as inputs, namely 0°, 90°, 180° and 270° respectively. For example, and in no way limiting the scope of the invention, in some scenarios, the PC BITS of the M-BIT BCC are equal to 5 bits of the 32-bit thermometric code, i.e. 25, which is the size of the sequence of combinations constituting the 32-bit thermometric code.

As depicted in FIG. 6, each of the pair of data sampler 602A and 602B is correspondingly coupled through a first clock signal (CLK) and a first complement (inverted) clock signal (CLKZ) to the PI 606A.

Likewise, as depicted in FIG. 6, the PI 606B comprises a pair of inputs, namely a second 32-bit thermometric code with an offset, for instance of +16 (PI-code/2), and a second quad<1:0> defining a second quadrant of operation in a unit phase circle. Specifically, the offset of +16 in the 32-bit thermometric code (or PI-code) applied to the PI 606B is a mid-code and corresponds to a phase difference of 45° with respect to the first 32-bit thermometric code (or PI-code) applied to the PI 606A. The PI 606B comprises a second set four distinct phases as inputs, namely 0°, 90°, 180° and 270° respectively.

As depicted in FIG. 6, each of the pair of edge sampler 604A and 604B is correspondingly coupled through a second clock signal (CLK) and a second complement (inverted) clock signal (CLKZ) to the PI 606B.

In operation, the clock phases are aligned by the PI-based CDR 600 so that one phase aligns with the edge (edge-sample) and the other phase is at the center of the data bit (data-sample).

In some embodiments, calibration of the Integral Nonlinearity (INL) of the PI-based CDR via implementing the PI-code and dynamically monitoring the PI-code is disclosed.

In general, the term "Integral Nonlinearity or INL" refers to describing the maximum deviation between the ideal output of a digital-to-analog converter (DAC) and the actual output level subsequent to removal of offset and gain errors. The term is often used as an important specification for measuring error in a DAC.

The transfer function of a DAC should ideally be a line and the INL measurement depends on the line selected. Two often used lines are the best fit lines, which is the line that minimizes the INL result and the endpoint line which is a line that passes through the points on the transfer function corresponding to the lowest and highest input code. In all cases, the INL is the maximum distance between the ideal line selected and the actual transfer function.

In operation, each of the pair of PI 606A and 606B is correspondingly controlled by the first and second 32-bit thermometric codes implemented over 2-bit quadrants thereby resulting in 128 steps, i.e. 32-bit thermometric code*22 (or 4)=128. For purposes of clarity and expediency, the first and second 32-bit thermometric codes correspondingly controlling each of the pair of PI 606A and 606B has been hereinafter referred to as a PI code. As a consequence, each of the pair of PI 606A and 606B may provide a constant increment in delay for each step increase in the PI code.

In some embodiments involving real time implementation of the PI code, the PI code fails to exhibit a linear delay vis-à-vis one or more additional distinct codes controlling each of the pair of PI 606A and 606B based on at least one of a 4-phase clock offset as input to each of the pair of PI 606A and 606B, an intrinsic code-dependent offset owing to each of the pair of PI 606A and 606B and a 4-phase clock offset as output of each of the pair of PI 606A and 606B.

Further, in operation, a CDR control logic unit, for instance the CDR control logic unit 108 or 312 of FIG. 1 or 3, (not shown here explicitly) sets the PI code to obtain a certain delay.

In some embodiments, the CDR control logic unit 108 or 312 of FIG. 1 or 3, (not shown here explicitly) comprises a first (or 1ST) order proportional loop 608 (not shown here explicitly) and a second (or 2ND) order integral loop 610 (not shown here explicitly).

In some scenarios, in the event that the input data and the High Speed (HS) internal clock of a receiver are at exact same frequency, the PI code is almost constant, for instance changes by only +/−2 or 3 codes out of 128 steps due to the 1st order proportional loop 608.

In some scenarios, in the event that the input data and the High Speed (HS) internal clock of the receiver have a frequency offset, the PI code constantly changes to maintain synchronization with the changing phase due to the second (or 2ND) order integral loop 610. Further, there may be additional variation of +/−2 or 3 codes out of 128 steps caused by the 1ST order proportional loop 608 to track changing noise.

In some embodiments, tracking a fixed frequency offset is disclosed. In some scenarios, in the event that each of the pair of PI 606A and 606B is ideal, the PI code changes at a constant rate. In operation, in the event that the CDR control logic unit 108 or 312 of FIG. 1 or 3, (not shown here explicitly) is allowed to run constantly and the PI code is logged at each time cycle, the effect of random noise is averaged out. In some ideal scenarios, each and every PI code is utilized equal number of times.

In some non-ideal scenarios involving tracking frequency offset, long term statistics of the PI code shows that the frequency of occurrence of the some of the PI codes is high, whereas the frequency of occurrence of others is low. The variation in the frequency of occurrence of the PI codes is owing to the fact that each of the pair of PI 606A and 606B fails to create a monotonous (montonic) increment in the phase by a monotonous (montonic) change in the PI code of the second (or 2ND) order integral loop 610. As a consequence, the 1ST order proportional loop 608 attempts to correct the PI error.

Further, the long term statistics of the PI code, for example as provided by a histogram of the PI code, indicates the PI non-linearity.

For each PI code, the corresponding non-linearity information may be mapped for correction of each PI code, thereby eliminating the need for High Speed (HS) measurements of small offsets in the analog domain. In some embodiments, the periodicity of capture or acquisition of the statistics may be at least one of one-time and repetitive, i.e. performed everytime upon power-up. In some embodiments, the automatic management of the statistics may be performed via external implementation of a digital Built-In Self-Test (BIST), as part of a normal functionality.

In some embodiments, a method of application of offset is disclosed, in accordance with the principles of the present invention. Each correction to each PI code may be performed via digitally implementing the PI code. In some embodiments, a look-up table 614 (not shown here explicitly) of offsets may be utilized. The look-up table 614 may be utilized for at least one of additional increments and decrements in the implementation of a shift register 616 (not shown here explicitly). As a consequence, the storage and application of the information is simple. The application is digital and, thus requires no analog control circuit.

In some embodiments, the number of PIs is four (or 4). Each PI generates two (or 2 or pair of) distinct phases separated apart by 180° (or π radians). As a consequence, there are a total of eight (or 8) distinct phases. For example, the eight (or 8) distinct phases are 0°, 45°, 90°, 135°, 180°, 225°, 270°, 315° respectively.

Figure 7:
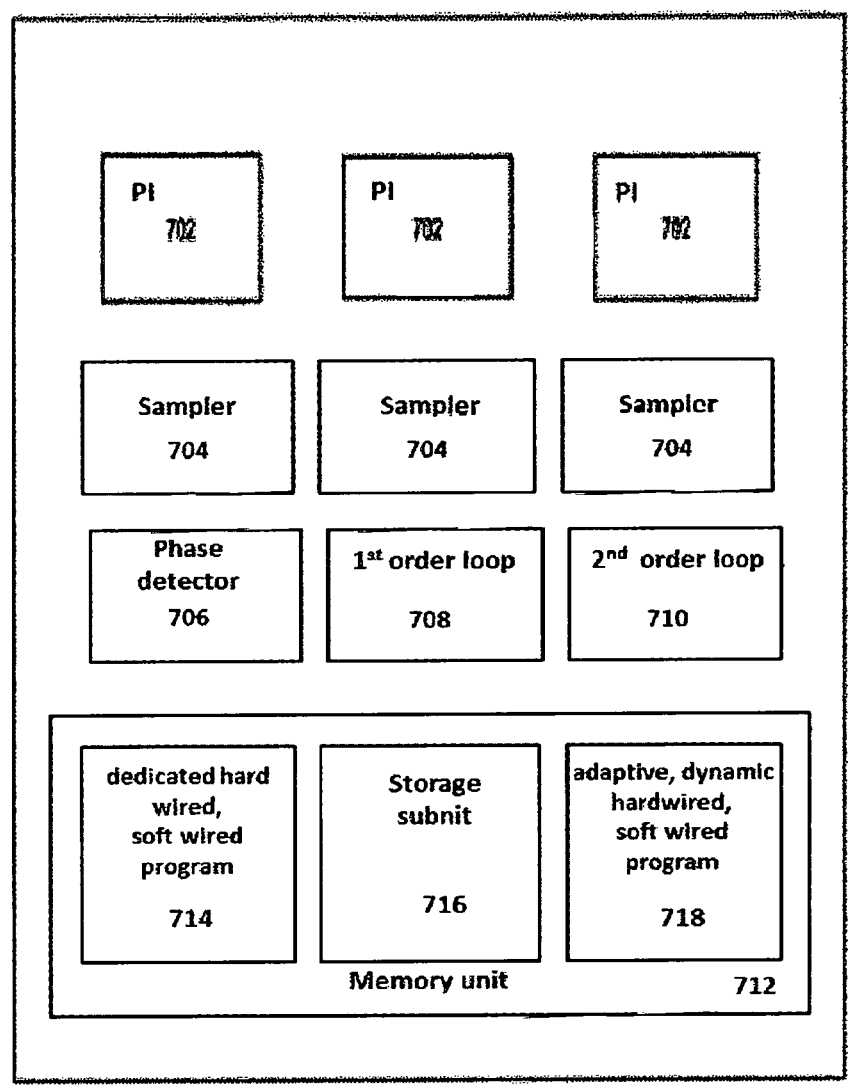
FIG. 7 depicts a simple block diagram of the modified PI-based CDR for dynamic calibration of Integral Nonlinearity (INL), according to one or more embodiments While the method and apparatus is described herein by way of example for several embodiments and illustrative drawings, those skilled in the art will recognize that method and system for managing estimation and calibration of non-ideality or linearity of a PI-based CDR circuit is not limited to the embodiments or drawings described. It should be understood, that the drawings and detailed description thereto are not intended to limit embodiments to the particular form disclosed. Rather, the intention is to cover all modifications, equivalents and alternatives falling within the spirit and scope of method and apparatus for managing estimation and calibration of non-ideality or linearity of a PI-based CDR circuit defined by the appended claims.

FIG. 7 depicts a simple block diagram of the modified PI-based CDR for dynamic calibration of Integral Nonlinearity (INL), according to one or more embodiments.

The modified PI-based CDR 700 comprises at least a plurality of Phase Interpolators (PIs) 702, at least a plurality of samplers 704, a Phase Detector (PD) 706, a first (1ST) order proportional loop 708, a second (or 2nd) order integral loop 710 and a memory unit 712.

The Phase Detector (PD) 706 detects early and late signals.

The first (1st) order proportional and a second (or 2nd) order integral loop uses the detected early and late signals so as to control the PIs 702 for tracking phase of an incoming data.

The memory unit 712 comprises at least one of a dedicated hard wired, soft wired program 714, and a combination thereof, for capturing statistics in connection with a sequence of a Binary Control Code (BCC) of the PIs to determine non-uniformity in the frequency of occurrence of one or more combinations thereof.

The memory unit 712 comprises a storage subunit 716 for storing one or more codes for correction of the INL of the PIs 702.

The at least one of an adaptive, dynamic hardwired, soft wired program 718, and a combination thereof, for implementing the one or more stored codes for correction of the INL of the PIs.

In some embodiments, static calibration of PI INL at power-up is disclosed. The application of the PI-code for correction of the PI INL is same as disclosed in calibration of the integral INL of the PI-based CDR via implementation of the PI-code and dynamic monitoring of the PI-code. However, the method for static calibration of PI INL at power-up is different. Specifically, the local clock is used as data for calibration. More specifically, one PI is used as clock and another PI as data for INL calibration.

Advantageously, the PI-based CDR of the present invention facilitates calibration (on-line and off-line) for PI and clock skew.

Advantageously, the PI-based CDR facilitates design and implementation of low power circuits since higher offset is tolerated. Further, the offset is calibrated through one at least one of dynamic and static calibration disclosed.

In some embodiments, static calibration of PI INL at power-up is disclosed. The mode of application of the PI-code for correction of the PI INL is same as disclosed in calibration of the INL of the PI-based CDR via implementation of the PI-code and dynamic monitoring of the PI-code. However, the method for static calibration of PI INL at power-up is different. Specifically, the local clock is used as data for calibration. More specifically, one PI is used as clock and another PI as data for INL calibration.

Advantageously, the PI-based CDR of the present invention facilitates calibration (on-line and off-line) for PI and clock skew.

Advantageously, the PI-based CDR facilitates design and implementation of low power circuits since higher offset is tolerated. Further, the offset is calibrated through one at least one of dynamic and static calibration disclosed.

The embodiments of the present invention may be embodied as methods, system, apparatus, electronic devices, and/or computer program products. Accordingly, the embodiments of the present invention may be embodied in hardware and/or in software (including firmware, resident software, micro-code, etc.), which may be generally referred to herein as a "circuit" or "module". Furthermore, the present invention may take the form of a computer program product on a computer-usable or computer-readable storage medium having computer-usable or computer-readable program code embodied in the medium for use by or in connection with an instruction execution system. In the context of this document, a computer-usable or computer-readable medium may be any medium that can contain, store, communicate, propagate, or transport the program for use by or in connection with the instruction execution system, apparatus, or device.

These computer program instructions may also be stored in a computer-usable or computer-readable memory that may direct a computer or other programmable data processing apparatus to function in a particular manner, such that the instructions stored in the computer usable or computer-readable memory produce an article of manufacture including instructions that implement the function specified in the flowchart and/or block diagram block or blocks.

The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium include the following: hard disks, optical storage devices, a transmission media such as those supporting the Internet or an intranet, magnetic storage devices, an electrical connection having one or more wires, a portable computer diskette, a random access memory (RAM), a read-only memory (ROM), an erasable programmable read-only memory (EPROM or Flash memory), an optical fiber, and a compact disc read-only memory (CD-ROM).

Computer program code for carrying out operations of the present invention may be written in an object oriented programming language, such as Java®, Smalltalk or C++, and the like. However, the computer program code for carrying out operations of the present invention may also be written in conventional procedural programming languages, such as the "C" programming language and/or any other lower level assembler languages. It will be further appreciated that the functionality of any or all of the program modules may also be implemented using discrete hardware components, one or more Application Specific Integrated Circuits (ASICs), or programmed Digital Signal Processors or microcontrollers.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the present disclosure and its practical applications, to thereby enable others skilled in the art to best utilize the invention and various embodiments with various modifications as may be suited to the particular use contemplated.

The methods described herein may be implemented in software, hardware, or a combination thereof, in different embodiments. In addition, the order of methods may be changed, and various elements may be added, reordered, combined, omitted, modified, etc. All examples described herein are presented in a non-limiting manner. Various modifications and changes may be made as would be obvious to a person skilled in the art having benefit of this disclosure. Realizations in accordance with embodiments have been described in the context of particular embodiments. These embodiments are meant to be illustrative and not limiting. Many variations, modifications, additions, and improvements are possible. Accordingly, plural instances may be provided for components described herein as a single instance. Boundaries between various components, operations and data stores are somewhat arbitrary, and particular operations are illustrated in the context of specific illustrative configurations. Other allocations of functionality are envisioned and may fall within the scope of claims that follow. Finally, structures and functionality presented as discrete components in the example configurations may be implemented as a combined structure or component. These and other variations, modifications, additions, and improvements may fall within the scope of embodiments as defined in the claims that follow.

While the foregoing is directed to embodiments of the present invention, other and further embodiments of the invention may be devised without departing from the basic scope thereof, and the scope thereof is determined by the claims that follow.

The invention claimed is:

1. A method for managing estimation and calibration of non-ideality of a Clock and Data Recovery (CDR) circuit, the method comprising:
   A) selecting a first output path for calibration comprising a first Phase interpolator (PI) of a plurality of PIs, a first delay element (308A) of a first set of delay elements (308), a clock delay element (314), at least one sampler, and input and data selector multiplexers, wherein the plurality of PIs receive a plurality of input signals;
   B) programming the first delay element (308A) of the first set of delay elements (308) using a first Digital Delay Control Code (DDCC);
   C) calibrating the clock delay element (314) using a Digital External Delay Control Code (DEDCC) until a predetermined criterion is met, wherein the predetermined criterion is based on an early-late detection method;
   D) upon satisfaction of the predetermined criterion, retaining the DEDCC in the clock delay element (314) for subsequent use;
   E) selecting a second output path for calibration comprising a second PI of the plurality of PIs, a second delay element (308B) of the first set of delay elements (308), the clock delay element (314), at least one sampler, and the input and data selector multiplexers;
   F) calibrating the second delay element (308B) of the first set of delay elements (308) using a second DDCC until the predetermined criterion is met;
   G) upon satisfaction of the predetermined criterion, retaining the second DDCC in the second delay element (308B) of the first set of delay elements (308) for subsequent use;
   H) repeating the steps E-G for the remaining PIs of the plurality of PIs such that the remaining delay elements of the first set of delay elements are separately calibrated;
   I) selecting a first input path for calibration comprising the first PI, a first delay element (304A) of a second set of delay elements (304), the clock delay element (314), at least one sampler, and the input and data selector multiplexers;
   J) programming the first delay element (304A) of the second set of delay elements (304) using a third DDCC;
   K) calibrating the clock delay element (314) using the DEDCC when the first delay element (304A) of the second set of delay elements (304) is programmed using the third DDCC, wherein the clock delay element (314) is calibrated until the predetermined criterion is met, thereby recalibrating the clock delay element (314);
   L) upon satisfaction of the predetermined criterion, retaining the DEDCC in the clock delay element (314) for subsequent use;
   M) providing a Binary Control Code (BCC) to each PI of the plurality of PIs to select an input signal of the plurality of input signals, wherein the input signal is provided to the plurality of PIs;
   N) selecting a second input path for calibration comprising the second PI, a second delay element (304B) of the second set of delay elements (304), the clock delay element (314), at least one sampler, and the input and data selector multiplexers;
   O) calibrating the second delay element (304B) of the second set of delay elements (304) using a fourth DDCC until the predetermined criterion is met;
   P) upon satisfaction of the predetermined criterion, retaining the fourth DDCC in the second delay element (304B) of the second set of delay elements (304) for subsequent use; and
   Q) repeating the steps N-P for the remaining PIs of the plurality of PIs such that the remaining delay elements of the second set of delay elements (304) are separately calibrated.

2. A method for managing estimation and calibration of input errors of a plurality of PIs in a Clock and Data Recovery (CDR) circuit, the method comprising:
   A) selecting a first input path for calibration comprising a first Phase Interpolator (PI) of the plurality of PIs, a first delay element (304A) of a first set of delay elements (304), a clock delay element (314), at least one sampler, and input and data selector multiplexers, wherein the plurality of PIs receive a plurality of input signals;
   B) programming the first delay element (304A) using a first Digital Delay Control Code (DDCC);
   C) calibrating the clock delay element (314) using a Digital External Delay Control Code (DEDCC) when the first delay element (304A) is programmed, wherein the clock delay element (314) is calibrated until a predetermined criterion is met, and wherein the predetermined criterion is based on an early-late detection method;
   D) upon satisfaction of the predetermined criterion, retaining the DEDCC in the clock delay element (314) for subsequent use;
   E) providing a Binary Control Code (BCC) to each PI of the plurality of PIs to select an input signal of the plurality of input signals, wherein the input signal is provided to the plurality of PIs;
   F) selecting a second input path for calibration comprising a second Pt of the plurality of PIs, a second delay element (304A) of the first set of delay elements (304), the clock delay element (314), at least one sampler, and the input and data selector multiplexers;
   G) calibrating the second delay element (304B) using a second DDCC until the predetermined criterion is met;
   H) upon satisfaction of the predetermined criterion, retaining the second DDCC in the second delay element (304B) for subsequent use; and
   I) repeating the steps E-H for the remaining PIs of the plurality of PIs such that the remaining delay elements of the first set of delay elements (304) are separately calibrated.

3. A Clock and Data Recovery (CDR) circuit with a calibration of a plurality of Integral Nonlinearity (INLs), the CDR circuit comprising:
   a first set of delay elements (304) that receives a plurality of input signals and a first plurality of digital delay control codes (DDCCs), and generates a plurality of delayed input signals corresponding to the plurality of input signals, thereby compensating errors in the plurality of input signals;
   a plurality of Phase Interpolators (PIs) (306) that receives a plurality of Binary Control Codes (BCCs) and are connected to the first set of delay elements to receive the plurality of delayed input signals, and generates a plurality of edge and data signals, wherein the plurality of edge and data signals are generated based on interpolation of the plurality of input signals, and wherein the plurality of PIs (306) have the corresponding plurality of INLs;

a second set of delay elements (308) that receives a second plurality of DDCCs and is connected to the plurality of PIs (306) to receive the plurality of edge and data signals, and generates a plurality of output signals, wherein the plurality of output signals are delayed versions of the plurality of edge and data signals, wherein the plurality of INLs of the corresponding plurality of PIs is compensated by corresponding delays in the plurality of edge and data signals;

an input selector multiplexer (318) that is connected to a first delay element of the first set of delay elements (304) to receive a first input signal of the plurality of input signals and a first delay element of the second set of delay elements (308) to receive a first output signal of the plurality of output signals, and outputs at least one of the first input signal and the first output signal, wherein the input selector multiplexer (318) outputs the first input signal when a first input path is selected and the first output signal when a first output path is selected;

a clock delay element (314) that receives a Digital External Delay Control Code (DEDCC) and connected to the input selector multiplexer (318) for receiving at least one of the first input signal and the first output signal, and outputs a delayed version of at least one of the first input signal and the first output signal as an input clock signal;

a data selector multiplexer (316) that receives an input data signal and is connected to the clock delay element (314) to receive the input clock signal, and outputs at least one of the input clock signal and the input data signal, wherein the data selector multiplexer (316) outputs the input clock signal during the calibration of the plurality of INLs of the corresponding plurality of PIs;

a plurality of samplers (310) connected to the corresponding second set of delay elements (308) and the data selector multiplexer (316) to receive the plurality of output signals and at least one of the input clock signal and the input data signal, respectively, and generates a plurality of sampled output signals;

a Phase Detector (PD) for receiving the plurality of sampled output signals and generating a corresponding plurality of early and late signals;

a first ($1^{st}$) order proportional loop and a second ($2^{nd}$) order integral loop for using the plurality of early and late signals so as to control the plurality of PIs for tracking a phase of incoming data; and a memory unit comprising:
  at least one of a dedicated hard wired, soft wired program, and a combination thereof, that receives the plurality of BCCs, determines a plurality of frequencies of occurrence of the corresponding plurality of BCCs, wherein a non-uniformity in the plurality of frequencies of occurrence of the corresponding plurality of BCCs indicates a presence of the plurality of INLs in the plurality of PIs;
  a storage subunit for storing one or more codes for correction of the plurality of INLs of the plurality of PIs; and
  at least one of an adaptive, dynamic hardwired, soft wired program, and a combination thereof, that provides the one or more codes to the plurality of PIs for correction of the plurality of INLs of the plurality of PIs, wherein the first and second sets of delay elements, the plurality of PIs, the clock delay element, the input and data selector multiplexers, the Phase Detector (PD), the $1^{st}$ order proportional loop, the $2^{nd}$ order integral loop, and the plurality of samplers are used for a static calibration of the CDR circuit, and wherein the plurality of PIs, the Phase Detector (PD), the plurality of samplers, the $1^{st}$ order proportional loop, the $2^{nd}$ order integral loop, and the memory unit are used for a dynamic calibration of the CDR circuit.

4. The CDR circuit of claim 3, further comprises a multiple-phase generator unit (302) that receives a single-phase clock input signal and generates the plurality of input signals, wherein the plurality of input signals have a first predetermined phase difference therebetween.

5. The CDR circuit of claim 3, wherein the plurality of BCCs have a predefined offset therebetween.

6. The CDR circuit of claim 3, wherein the plurality of PIs further generate a plurality of inverted edge and data signals.

* * * * *